(12) United States Patent
Burl et al.

(10) Patent No.: US 6,294,916 B1
(45) Date of Patent: Sep. 25, 2001

(54) NMR AND ESR PROBES FOR CLOSED LOOP CONTROL OF GRADIENT FIELDS

(75) Inventors: Michael Burl, Chagrin Falls, OH (US); Ian Robert Young, Marlborough (GB)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/431,539

(22) Filed: Oct. 29, 1999

(30) Foreign Application Priority Data

Oct. 29, 1998 (GB) .................................................. 9823580

(51) Int. Cl.⁷ ....................................................... G01L 3/00
(52) U.S. Cl. ............................................. 324/318; 324/322
(58) Field of Search .................................. 324/318, 322, 324/307, 309, 306

(56) References Cited

U.S. PATENT DOCUMENTS

| | | | |
|---|---|---|---|
| 3,244,876 | * | 4/1966 | Kanda et al. . |
| 3,342,991 | * | 9/1967 | Kroenbroger . |
| 3,557,777 | * | 1/1971 | Cohen ........................................ 128/2 |
| 3,597,679 | * | 8/1971 | Habfast .................................. 324/45 |
| 5,432,449 | | 7/1995 | Ferut et al. . |

OTHER PUBLICATIONS

M. Burl and I. Young; Eddy Currents and their Control; "Encyclopaedia of NMR" edited by D.M. Grant and R.K. Harris, Wiley, 1996; pp. 1841–1846.

* cited by examiner

*Primary Examiner*—Jay Patidar
*Assistant Examiner*—Brij B. Shrivastav
(74) *Attorney, Agent, or Firm*—John J. Fry; Eugene E. Clair

(57) ABSTRACT

Magnetic resonance imaging apparatus uses magnetic field gradients X, Y, Z to spatially encode the magnetic signals arising from a patient on a couch 2 in bore 1 of a main magnet. Thermal stresses arising from aggressive gradients during multiple acquisitions result in imperfectly repeated gradients and resulting image artefacts. The invention uses a probe 4 provided with a gradient coil set similar to that for imaging, and fed by currents derived from the imaging gradient coils, connected so as to produce an opposing gradient surrounding an MR active substance in the probe. This enables a probe with a sufficiently large amount of MR active substance to produce a useful signal to be used to monitor the gradient, while overcoming the de-phasing problem. which would otherwise occur. Closed loop control of gradients thereby becomes possible.

17 Claims, 3 Drawing Sheets

NMR AND ESR PROBES FOR CLOSED LOOP CONTROL OF GRADIENT FIELDS

This invention relates to magnetic resonance apparatus.

In magnetic resonance imaging, as is well known, magnetic resonance (MR) active nuclei in alignment with a main magnetic field are excited to resonance by the application of a pulse of r.f. energy at right angles to the main magnetic field, and r.f. signals generated after the pulse has ceased can be detected to give information on distribution of MR active nuclei e.g. $H_2$ in the body being imaged, which will give information about the type of tissue and its condition.

The spatial encoding of the resonance signals is achieved by applying magnetic field gradients in three orthogonal directions at the time the r.f. excitation pulse is applied and/or when r.f. (relaxation) signals are generated. To give an example of a magnetic field gradient, the patient might be lying on a couch with the main magnetic field in a direction from head to toe. The magnetic field gradient in this direction would have the effect that the magnetic field strength at the head of the patient, say, was greater than that at the centre of the patient, and the magnetic field strength at the toes would be less than that at the centre of the patient. The r.f. pulse would usually be of such a frequency as to excite only an axial slice of the patient, and the other two gradients would enable the distribution of MR active nuclei in orthogonal directions in the plane of the slice to be represented.

Unpaired electrons of atoms have also been used (as in electron spin resonance—ESR) to provide the same imaging information as MR active nuclei (nuclear magnetic resonance—NMR).

In the case of NMR, to obtain increased resolution in the MR image implies increasing gradients if the acquisition time is not to be increased, but this increases the mechanical stresses in the gradient windings and the thermal effects caused by the heating effects of the currents in the coils which are responsible for producing the magnetic gradients.

Typically, an MR image is built up from multiple acquisitions of data and, while the differences in the gradients from one acquisition to the next may be of the order of only 0.1%, the resulting artifacts in the image are several times as significant as those caused by noise.

It would be desirable to be able to measure MR gradients, not only to be able to control them between acquisitions, but also to be able to calibrate them in terms of position corresponding to a respective magnetic field strength.

The use of NMR probes for setting and checking the main field of magnet is well known (Eddy Currents and their Control, M Burl, I Young, Encyclopedia of NMR Edited by D M Grant and R K Harris, Wiley, 1996, pages 1845, 1846. Such probes consist of a MR active substance, usually doped water contained in a bulb, surrounded by a receiver coil. ESR probes have been used in the same way.

If used for calibrating gradients, the probe should be small in order to give as precise an indication as possible of the source of the r.f. signals. However, the signal from such a small probe would have a poor s/n ratio, and so multiple measurements and averaging would be necessary.

If the probe was simply made larger, the signal from the probe would decay rapidly, since the spins are de-phased (dispersed) by the gradient, and a large object would result in a quick loss of signal.

The invention provides magnetic resonance apparatus comprising gradient coils for generating magnetic field gradients, a probe for monitoring a magnetic field gradient, the probe comprising an MR active substance and a coil for receiving r.f. signals from the substance, and a gradient coil surrounding the MR active substance and arranged to produce a magnetic field gradient which opposes that of the gradient being monitored.

The gradient coil surrounding the MR active substances enables the gradient being monitored to be reduced or cancelled, enabling a larger volume of MR active substance to be used without the disadvantages noted above.

The magnetic resonance apparatus may be for imaging. Advantageously, there is provided means for supplying the probe gradient coil with current derived from that supplied to the respective imaging gradient coil, for example, a fraction of the latter current can be tapped off using resistive means.

The opposing gradient produced by the gradient coil may be equal and opposite to that produced by the imaging coils to achieve cancellation of the imaging gradient over the region of the MR active substance.

Preferably, gradient coils surround the MR active substance to oppose three orthogonal imaging gradients.

Advantageously, the output of the probe provides an error signal for correcting for errors in the demanded imaging gradient.

One way of carrying out the invention will now be described in detail, by way of example, with reference to the accompanying drawings, in which.

Figure 1:
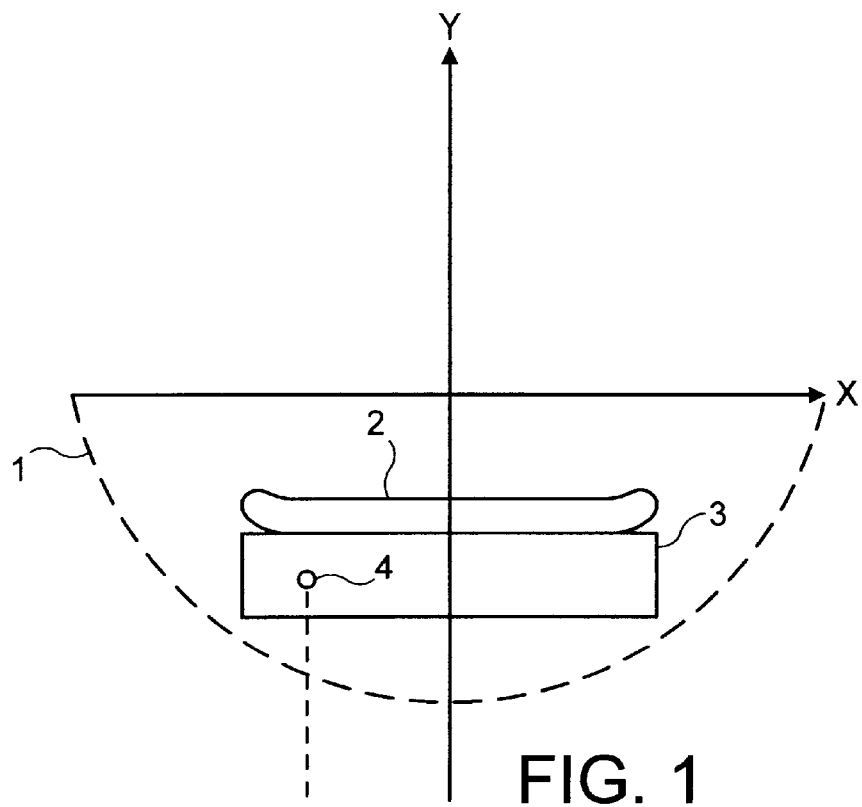
FIG. 1 is a schematic axial cross-section showing part of the magnetic resonance imaging apparatus according to the invention.

The magnetic resonance imaging apparatus shown schematically in FIG. 1 has an electromagnet with a central bore 1 which generates a main magnetic field in the Z direction which is perpendicular to the plane of FIG. 1. Inside the bore 1 is mounted a couch 2 for supporting the patient in an examination region, and this is in turn supported on a beam 3. Located within the casing of the electromagnet around the periphery of the bore 1 are gradient coil sets for creating magnetic field gradients in three orthogonal directions X, Y and Z. The result of this when the main field is switched on and, say, the X gradient is also switched on, the magnetic field varies linearly over the examination region in the X direction. While the magnetic field is axial with respect to the bore 1, it is greater at regions to the left of the axis than at regions to the right of the axis. The Y and Z gradient coils can also be switched on to vary the strength of the magnetic field in the Y and Z directions.

Figure 3A:
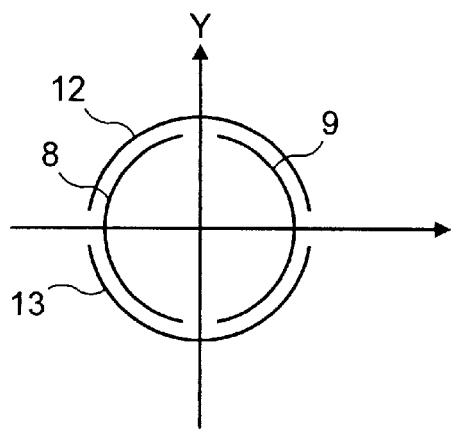
FIG. 3a is an end view of the probe and coil set of FIG. 3, showing only the X and Y gradient coils.
Figure 3:
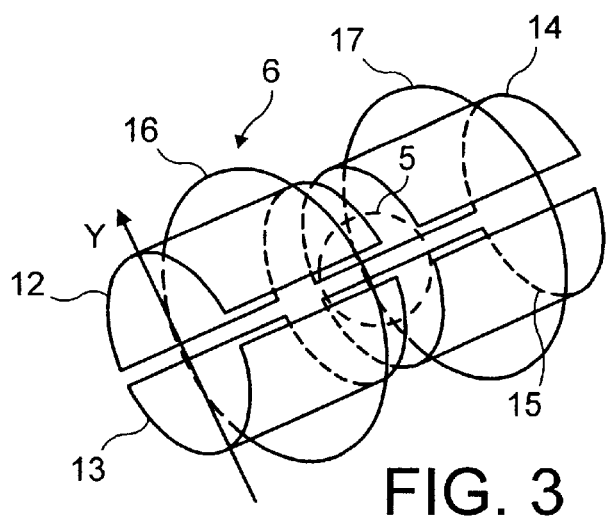
FIG. 3 is a perspective view showing a probe of the magnetic resonance imaging apparatus of FIG. 1, together with the Y and Z gradient coils of the probe.
Figure 4:
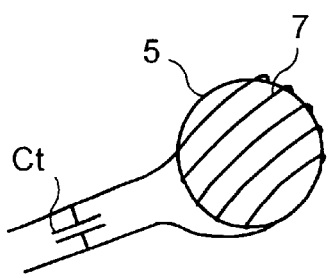
FIG. 4 shows the probe without its gradient coil set but with an r.f. transmit/receive coil.

Within the beam 3, there is provided a probe 4 which is shown in greater detail in FIGS. 3 and 4. The probe 4 consists of a vial 5 containing an MR active substance together with a gradient coil set indicated generally by the reference numeral 6, together with an r.f. transmit/receive coil 7. The gradient coil set 6 is similar in configuration and orientation to the gradient coil set which produce the magnetic field gradients used for spatially encoding the magnetic resonance signals. Thus, the Y gradient is produced by two pairs of coils 12, 13, 14, 15 which each extend a little less than half way around the outer periphery of the bore 1 of the magnet, and the X gradients are produced by another two pairs of similar coils which are arranged inside the Y gradient coils but rotated through 90° compared to the Y gradient coils. For clarity, these X gradient coils are not shown in FIG. 3, but one pair 8,9 are seen in the end view of FIG. 3a. The Z gradient is produced by the annular coils 16,17.

The gradient coil set of the imaging apparatus is arranged with its axis coincident with the Z axis of the imaging apparatus, and the probe coil set is therefore arranged in the same orientation i.e. the axis of the coil set is normal to the plane of FIG. 1 of the drawings, and the X and Y coil pairs are arranged at the same angular positions as those for the gradient coil set.

Figure 5:
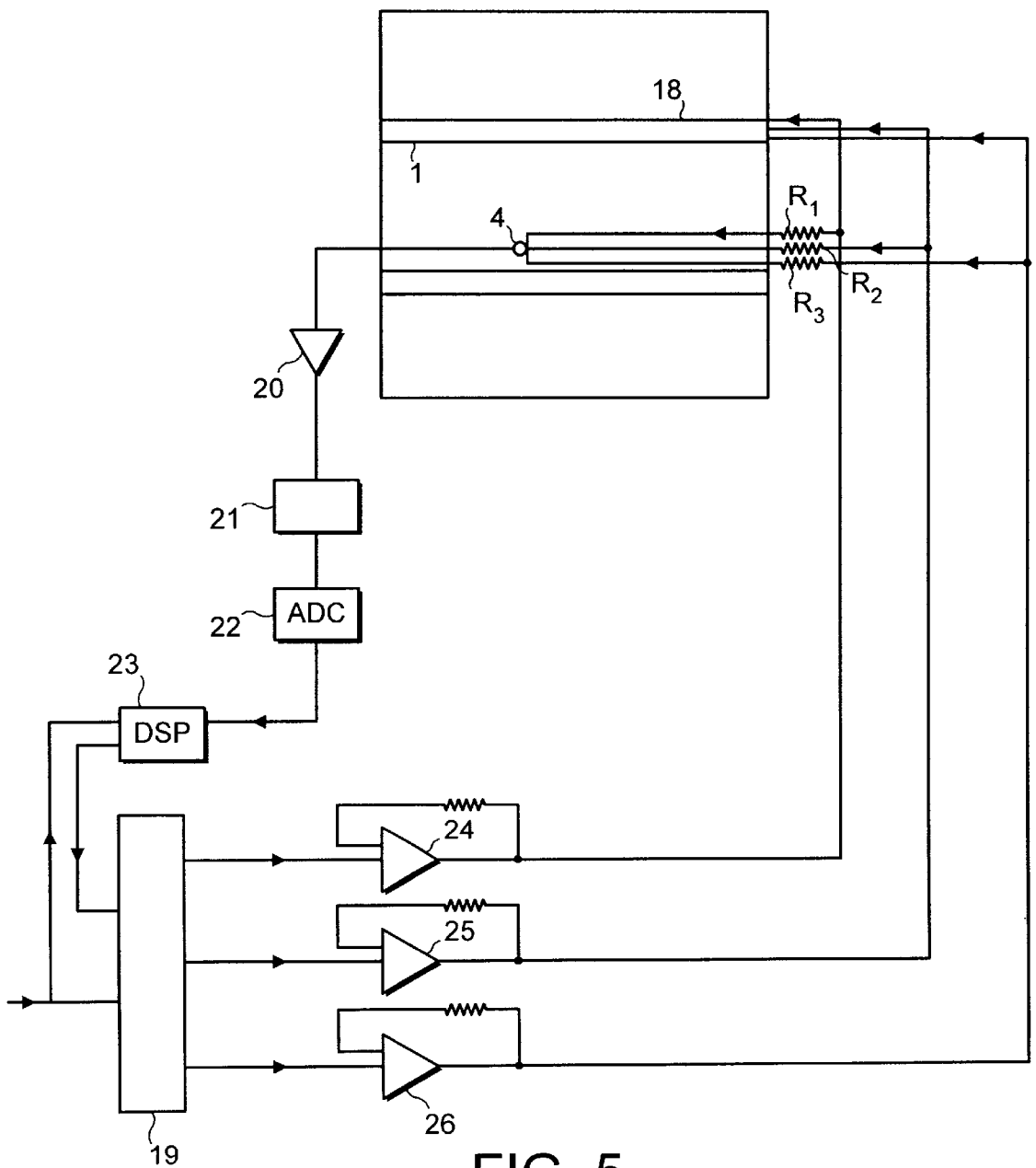
FIG. 5 is a block circuit diagram of the means for driving the gradient coil sets.

Referring to FIG. 5, the coils of the probe coil set are driven with the currents derived from those supplied, via output 19, to the imaging gradient coils but, in the case of the probe coil set, resistive means $R_1$ to $R_3$ in the path of the currents restrict the currents to fractions of those in the main coil set. $R_1$ to $R_3$ are in fact adjusted so that the magnitudes of the gradient fields applied to the MR active substance are the same as for the imaging gradients. Secondly, the coils are fed so that the current passes around the individual coils in the reverse sense to that for the main coil set. The result is that the gradients applied to the MR active substance by the imaging gradient coils is cancelled by the probe gradient coils.

Even though the coils of the probe coil set are fed with fractions of a current which pass through the coils of the main coil set, nevertheless, the gradient created is the same (but in the reverse sense), because the sensitivity of the coils of the probe coil set is greater because of the smaller size of those coils.

Figure 2:
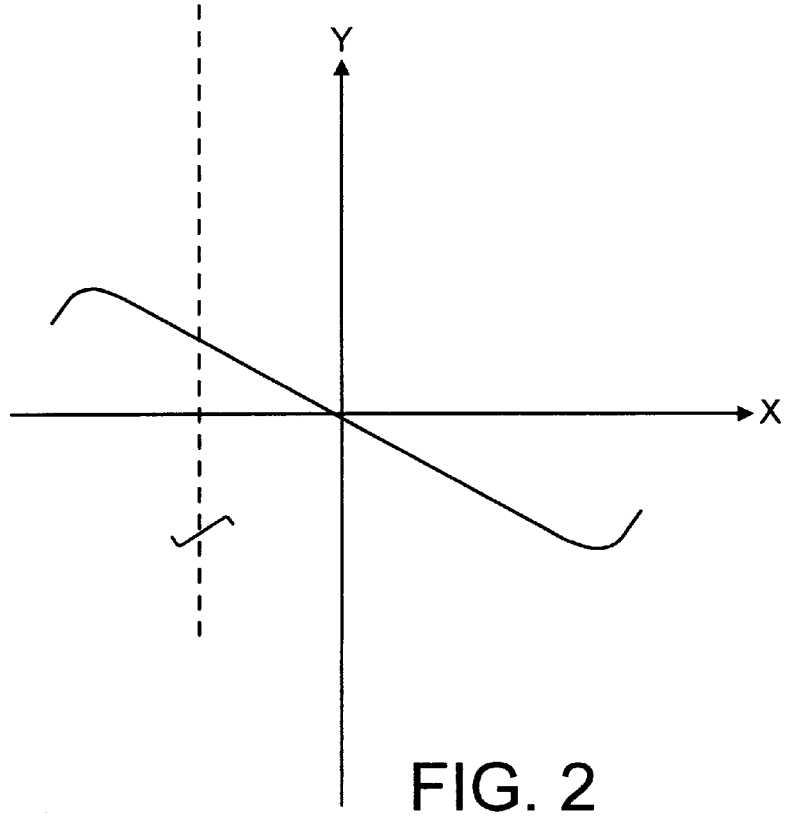
FIG. 2 is a graph showing the field strength of the imaging gradient in the X direction.

Referring to FIG. 2, the imaging gradient in the X direction is shown, together with the opposing gradient produced around the vial 5 (centred around the vertical dotted line). The gradient coil set 6 also subjects the vial 5 to gradients which similarly oppose the main Y and Z gradient fields.

When a pulse sequence is applied to the main gradient coils 18 equal and opposite gradients are applied to the vial 5. Thus, when the transmit/receive coil 7 is excited, the signal induced in the MR active substance is not de-phased, and the resonance detected will be offset by a frequency $\gamma G_x x$, where $\gamma$ is the known gyromagnetic ratio, Gx is the applied gradient in the X direction and x is the known displacement of the probe from the centre of the apparatus. This offset frequency can then be compared with that calculated from the gradient being demanded by the control system multiplied by the distance offset of the probe and the gyromagnetic ratio. Corresponding resonances will be detected in respect of the Gy and Gz gradients.

Because the imaging gradients are cancelled in the region of the MR active substance, de-phasing of the resonance signals from the MR active substance does not occur, allowing a sufficiently large amount of MR active substance to be used to produce a usefully large signal.

This then offers the possibility of controlling the gradient fields in a closed loop fashion. Referring to FIG. 5, output circuit 19 receives from the control system signals which cause the output circuit 19 to supply the appropriate inputs to the gradient amplifiers 24 to 26 to generate the required currents in the main gradient coils to produce those required gradient fields. The signals from the probe 4, which will be representative of the gradients actually encountered are amplified at pre-amplifier 20, demodulated in block 21 and converted to digital form in block 22 to allow digital signal processing in block 23. Block 23 also receives the input signal from the control system and is therefore able to generate error signals, so that the output circuit 19 now produces computer generated commands plus digital signal processing correction signals for the main gradient coils.

As an example, the vial could be a bulb of 5 mm diameter containing water. The water is preferably doped to reduce T1 relaxation times, in order to prevent this being a limiting factor in the choice of repetition time (TR), although the vial could be filled with a gel to reduce the possibility of leakage, although such a gel could be less MR active. The bulb could be any diameter up to one centimetre, and in principle could be larger, although the restriction here would be the space taken up by the bulb.

While the magnetic resonance imaging apparatus has been described with a single probe 4 in fact it would be desirable for there to be two probes provided to monitor each of the three X, Y, Z gradients. Two probes allow compensation of any errors; by taking a difference signal between the two, positioning and other errors are minimised. Each pair should be positioned on either side of the mid-point of the respective gradient it was monitoring.

While the coil 7 is transmit/receive, if desired, the excitation of the MR active substance could be performed by the r.f. coil of the imaging apparatus. There would be advantages to the use of the coil 7 for excitation, since the pulse sequence applied to the r.f. coil and gradient coils of the imaging apparatus could be inappropriate to the probe. In the case of coil 7 being transmit/receive, the coil would be surrounded by an r.f. screen arranged on the inside of the gradient coil set, Ct is a tuning capacitor.

The main magnet has been described as being an electromagnet, and this could be either resistive or superconducting, but the invention is also applicable to apparatus where the main field is produced by a permanent magnet.

While the above description has been in relation to an NMR probe, the invention is also applicable to a probe for monitoring gradients in ESR imaging apparatus. In this case, much higher resonant frequencies (multiplied by 500 or so) would be used. Further, while the above description has been in relation to an imaging apparatus, the invention is also applicable to spatially localised spectroscopy.

Having described a preferred embodiment of the invention, the following is claimed:

1. A magnetic resonance apparatus comprising:
   a gradient coil to generate a magnetic field gradient in the magnetic resonance apparatus; and
   a probe for monitoring the magnetic field gradient, the probe comprising:
      a magnetic resonant active substance located in the magnetic field gradient;
      a coil for receiving radio frequency signals from the magnetic resonant active substance; and
      a probe gradient coil surrounding the magnetic resonant active substance,
      wherein the probe gradient coil produces a magnetic field that is a gradient magnetic field.

2. The magnetic resonance apparatus of claim 1 including an electrical connection for supplying the probe gradient coil with at least a portion of the current supplied to the gradient coil to generate a magnetic field gradient.

3. The magnetic resonance apparatus of claim 1 including an error signal generator connected to the output of the probe, whereby the error signal generator provides an error signal for closed loop correction of the gradient coil for the magnetic field gradient.

4. The magnetic resonance apparatus of claim 1 including at least a pair of probes for monitoring the magnetic field gradient.

5. The magnetic resonance apparatus of claim 1 wherein the coil for receiving radio frequency signals is a transmit/receive radio frequency coil.

6. The magnetic resonance apparatus of claim 1 wherein the magnetic resonance active substance is water-based.

7. The magnetic resonance apparatus of claim 1 wherein the magnetic resonance active substance contains magnetic resonance active nuclei.

8. The magnetic resonance apparatus of claim 1 wherein the magnetic resonance active substance contains magnetic resonance active unpaired electrons.

9. The magnetic resonance apparatus of claim 1 including a controller having an input connected to the output of the probe, the controller including an output controllably connected to generate a magnetic field gradient with the gradient coil.

10. A method for controlling a magnetic field gradient in a magnetic resonance apparatus, the method comprising the steps of:

determining a desired magnetic field gradient;
   generating a magnetic field gradient;
   monitoring the magnetic field gradient;
   determining a difference between the desired magnetic field gradient and the generated magnetic field gradient;
   providing a signal indicative of the difference; and
   controlling the generation of the magnetic field gradient in response to the signal.

11. The method of claim 10 wherein the step of monitoring includes generating a second magnetic field to affect at least a portion of the monitored magnetic field gradient.

12. The method of claim 11 wherein the second magnetic field generated is a gradient magnetic field.

13. The method of claim 11 wherein the second gradient magnetic field opposes the monitored gradient magnetic field.

14. The method of claim 10 wherein the step of monitoring includes exciting a transmit/receive radio frequency coil operatively located with respect to a probe.

15. The method of claim 10 wherein the step of monitoring includes the step of utilizing signals provided from at least two probes.

16. The method of claim 15 wherein the step of utilizing signals includes the step of determining a difference signal between the two signals from the at least two probes.

17. A probe for monitoring a magnetic field gradient, the probe comprising:

a magnetic resonant active substance;
   a coil for receiving radio frequency signals from the magnetic resonant active substance; and
   a probe gradient coil surrounding the magnetic resonant active substance, the probe gradient coil arranged to produce a magnetic field gradient to affect at least a portion of the gradient field being monitored.

* * * * *